United States Patent
Kuo et al.

(10) Patent No.: US 8,314,652 B2
(45) Date of Patent: Nov. 20, 2012

(54) SYSTEM AND METHOD FOR RC CALIBRATION USING PHASE AND FREQUENCY

(75) Inventors: Feng Wei Kuo, Zhudong Township, Hsinchu County (TW); Tsung-Hsien Tsai, Kaohsiung (TW); Jia-Liang Chen, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 146 days.

(21) Appl. No.: 12/777,293

(22) Filed: May 11, 2010

(65) Prior Publication Data

US 2011/0279175 A1    Nov. 17, 2011

(51) Int. Cl.
*H03B 1/00* (2006.01)
(52) U.S. Cl. ........................................... 327/551
(58) Field of Classification Search ................. None
See application file for complete search history.

(56) References Cited

U.S. PATENT DOCUMENTS

| | | | |
|---|---|---|---|
| 6,262,603 B1 | 7/2001 | Mohan et al. | |
| 6,507,790 B1 * | 1/2003 | Radomski | 702/39 |
| 7,064,557 B2 | 6/2006 | Pan et al. | |
| 7,120,413 B2 * | 10/2006 | Lee et al. | 455/260 |
| 7,298,179 B2 * | 11/2007 | Lewis | 327/34 |
| 7,372,339 B2 * | 5/2008 | Fu | 331/16 |
| 8,073,080 B2 * | 12/2011 | Li et al. | 375/332 |
| 2007/0207760 A1 | 9/2007 | Kavadias et al. | |
| 2009/0108858 A1 | 4/2009 | Kao et al. | |
| 2010/0259332 A1 * | 10/2010 | Tan | 331/17 |

OTHER PUBLICATIONS

Kuo, M.C. et al., "A 1.2 V 114 mW Dual-Band Direct-Conversion DVB-H Tuner in 0.13 um CMOS", IEEE Journal of Solid-State Circuits, Mar. 2009, 44(3):740-750.

\* cited by examiner

*Primary Examiner* — Lincoln Donovan
*Assistant Examiner* — Sibin Chen
(74) *Attorney, Agent, or Firm* — Duane Morris LLP

(57) ABSTRACT

An RC filter is calibrated to a desired cutoff frequency by initializing the filter with a cutoff frequency. An input signal is filtered by the RC filter to provide a filter output signal having phase and frequency values. The cutoff frequency of the RC filter is adjusted based on the phase and frequency values of the filter output signal if the phase and frequency values do not satisfy a predetermined condition. The filtering and adjusting are repeated until the phase and frequency values of the filter output signal satisfy the predetermined condition. A calibration apparatus has a frequency generator, a resistor-capacitor (RC) filter, a phase comparator, a frequency detector, and a state machine. The phase comparator, frequency detector, and state machine are configured to calibrate the RC filter to a cutoff frequency specified by the reference signal based on a filter output signal of the RC filter.

17 Claims, 9 Drawing Sheets

SYSTEM AND METHOD FOR RC CALIBRATION USING PHASE AND FREQUENCY

BACKGROUND

On-chip resistors and capacitors are commonly used in modern integrated circuits for a variety of purposes, including filtering signals in frequency. Resistor-capacitor (RC) circuits may be used to implement, e.g., low-pass filters, high-pass filters, or bandpass filters. Due to variations in process, voltage, and/or temperature, real (non-ideal) resistors and capacitors often exhibit considerable variation in resistance and capacitance, respectively. Such variation negatively impacts the precision and/or accuracy desired in filter characteristics, e.g., filter bandwidth.

Calibration techniques are commonly employed to compensate for such fluctuations in resistance and capacitance. A common technique is to adjust the capacitance of a variable capacitor for this purpose. Logic may be used to solve for the RC time constant commonly denoted by $\tau$, which is the product of resistance R and capacitance C. Then, because RC filter characteristics such as filter bandwidth are related to $\tau$ (e.g., the cutoff frequency of a lowpass RC filter is given by $f_c=1/(2\pi RC)$ Hz), such a variable capacitor may be adjusted to achieve desired filter characteristics.

FIG. 1 is a block diagram of a conventional RC calibration circuit 100 utilizing the aforementioned calibration technique. Such a configuration is well-described in the literature, e.g., in U.S. Pat. No. 6,262,603, "RC Calibration Circuit with Reduced Power Consumption and Increased Accuracy" by Mohan et al. and in U.S. Pat. Pub. No. 2009/0108858, "Methods and Systems for Calibrating RC Circuits," by Kao et al. Therefore, only the most salient features of the calibration circuit 100 are summarized hereinbelow.

Circuit 100 includes a resistor 110 and a variable capacitor 112 connected in parallel between a node N and ground. A current source 114 provides a current $I_N$ into node N. A voltage $V_N$ is defined across resistor 110 and capacitor 112. A switch 118 connects node N and ground when in a closed position. An analog comparator 122 provides at its output a comparison signal CMP at a first logic state when its input voltage $V_N$ is less than its input voltage $V_{Ref}$ and at a second logic state when $V_N$ is greater than $V_{Ref}$. A digital counter 120 receiving a clock signal CLK and a switch pulse SW provides a count CT based on comparison signal CMP as described further below. A digital logic block 116 provides switch pulse SW to control switch 118 and digital counter 120. Digital logic 116 further provides a digital control word DCW to control variable capacitor 112

Prior to operation of the calibration circuit 100, switch 118 is closed, and $V_N$ is at ground voltage. When operation begins at time $t_0$, digital logic 116 outputs switch pulse SW. In response to the rising edge of pulse SW, switch 118 opens and counter 120 begins counting rising edges of clock signal CLK. Voltage $V_N$ then rises according to the following equation:

$$V_N = V_{max}(1-e^{-t/\tau}), \quad (1)$$

where $V_{max}$ represents the maximum voltage across capacitor 112, t represents elapsed time, and $\tau$ represents the RC time constant. When $V_N$ exceeds $V_{Ref}$ (at a time denoted by $t_1$), comparator 122 changes the logic state of signal CMP, causing counter 120 to stop counting. Digital logic 116 captures the value of count CT at this time. Then, the next falling edge of pulse SW closes switch 118, causing VN to discharge back to ground, and resets counter 120 in preparation for another round of calibration.

Digital logic 116 uses the captured count CT of the number of clock pulses to solve equation (1) for $\tau$, making use of the fact that $V_N=V_{Ref}$ at time $t_1$ (within one significant bit of count CT). The calculated (measured) value of $\tau$ is compared with the desired RC constant, and digital logic sends a control word DCW to increase (if the calculated $\tau$ is less than the desired RC constant) or decrease (if the calculated $\tau$ is greater than the desired RC constant) the capacitance of variable capacitor 112. Thus, the calibration circuit 100 is calibrated to maintain a desired time constant RC.

FIG. 2 is a block diagram of a conventional technique for calibrating an RC circuit 200 using a variable bandwidth code that may be set to a desired bandwidth setting at each calibration. Much like calibration circuit 100, calibration circuit 200 employs a feedback configuration whereby a code, viz., capacitive code (CC) 250, is iteratively provided to adjust variable capacitance until a terminating condition corresponding to successful calibration is met. Unlike calibration circuit 100, however, calibration circuit 200 provides a bandwidth code (BWC) 241 that indicates a reference value for calibration. The prior art calibration circuit 200 has been described at U.S. Pat. Pub. No. 2009/0108858, "Methods and Systems for Calibrating RC Circuits," by Kao et al. and in Kuo et al., "A 1.2 V 114 mW Dual-Band Direct-Conversion DVB-H Tuner in 0.13 μm CMOS," IEEE Journal of Solid-State Circuits, Vol. 44, No. 3, p. 745-46 (March 2009); therefore, only the most salient features of the circuit are summarized hereinbelow.

Calibration circuit 200 comprises an integrator 260 employing resistors and capacitors configured to provide a voltage Von to a comparator 226, which may be a digital or analog comparator. The integrator 260 includes an operational amplifier (op-amp) 214, variable capacitors 220, 222, and switches 219-1, 219-2, 219-3. Inputs to operational amplifier 214 are coupled by way of resistors 250-1 and 250-2 to nodes at voltages $V_1$ and $V_2$, respectively, which are in turn coupled to other resistors and an amplifier as shown in FIG. 2. When switches 219-1 and 219-2 are closed, voltages $V_{op}$ and $V_{on}$ at output terminals 216, 218, respectively of op-amp 214 are at a common mode (CM) point of the op-amp. When the switches are opened, as described in further detail below, capacitors 220 and 222 discharge, causing $V_{op}$ to be charged to a maximum positive voltage output of op-amp 214 and causing $V_{on}$ to be charged to a maximum negative voltage output. Comparator 226 compares $V_{on}$ with a reference voltage $V_{Ref}$. Based on a counter 232 that counts clock pulses and based on bandwidth code 241, capacitive code 250 is updated, and the iterative feedback loop continues until a terminating condition is met as described below.

Specifically, a source clock 228 provides clock pulses $CLK_{IN}$ to a frequency divider 230, which generates clock pulses $CLK_A$ by reducing the frequency of $CLK_{IN}$ by $2^M$, where M is an integer indicating the number of comparisons performed by comparator 226 in one period of CLKA. N-bit counter 232 counts the number of pulses of $CLK_A$, where N is the number of bits used to calculate the capacitance of capacitors 220, 222. Frequency divider 234 generates clock pulses $CLK_B$ by reducing the frequency of $CLK_A$ by $2^{N+1}$. $CLK_B$ drives switches 219-1, 219-2, 219-3 and is also provided to comparator 226. At an initial time $t_0$, $CLK_A$, $CLK_B$, and $CLK_{IN}$ are high, and switches 219-1, 219-2, 219-3 are closed, and $V_{on}$ and $V_{op}$ are at a common mode point $V_{cm}$. At a falling edge of $CLK_B$ occurring at a time $t_1$, switches 219-1, 219-2, 219-3 are pulsed open, capacitors 220, 222 discharge, and $V_{on}$ starts decreasing. Counter 232 starts counting pulses of $CLK_A$ until $V_{on}$ falls below or equal $V_{ref}$ at a time $t_2$ as determined by comparator 226, at which time comparator 226 generates a signal 236 (denoted STOP in FIG. 2) causing counter 232 to stop counting and capture the counter value. Then, at a subsequent time $t_3$ corresponding to the next rising edge of $CLK_B$, switches 219-1, 219-2, 219-3 are closed and the cycle repeats. The capacitances for capacitors 220, 222 are updated based on the counter value as follows.

Subtractor 238 subtracts the count corresponding to the captured counter value from an N-bit bandwidth code 241 provided by a bandwidth code (BWC) controller 240. The manner in which the bandwidth code is provided is described in detail further below. If the difference calculated by subtractor 238 is zero as shown by calculation 242, a terminating condition is reached, and power to the calibration circuit 200 is cut off via cutoff circuit 244, because a difference of zero corresponds to an RC time constant operating at a predetermined time constant value as determined by the bandwidth code. If the difference is nonzero, the difference is added to a present capacitance code 248, and capacitance code generator 224 consequently provides a new capacitance code 250 to update the capacitances of capacitors 220, 222.

The bandwidth code that enables calibration at different values is determined as follows. The difference in time between $t_1$ and $t_2$ (denoted $\Delta t$), i.e., between when capacitors 220, 222 start to discharge and when $V_{on}$ drops below (or equals) $V_{ref}$, may be expressed as follows:

$$\Delta T = RC \frac{\Delta V_{out}}{\Delta V_{in}} - \frac{1}{f_{in}} BWC, \quad (2)$$

where $\Delta V_{in}=V_1-V_2$, $\Delta V_{out}=2(V_{cm}-V_{ref})$, and $f_{in}$ is an input clock frequency. This relationship simply relates decay of $V_{on}$ to the reference level $V_{ref}$. Then, because $BWC=(\Delta T)(f_{in})$, the bandwidth code is computed based on the captured pulse count of counter 232 and the frequency of $CLK_{IN}$. Thus, to calibrate an RC circuit at a desired channel bandwidth as in the prior art approach of FIG. 2, a simulation may first be performed to determine the length of time $\Delta T$, and the needed bandwidth code is obtained. This approach offers greater flexibility than the approach of FIG. 1

Another approach for RC calibration is disclosed at U.S. Pat. Pub. No. 2007/0207760, "Method and System for Filter Calibration Using Fractional-N Frequency Synthesized Signals" by Kavadias et al. Kavadias is directed to filter calibration using frequency synthesized signals. Aspects of the method disclosed in Kavadias include generating a LO signal by a phase locked loop (PLL) circuit within a chip. A reference signal is generated based on the generated LO signal and a synthesizer control signal. A frequency response for a filter circuit integrated within the chip is calibrated by adjusting parameters associated with the filter circuit based on the generated LO signal. Aspects of the system include a single-chip multi-band RF receiver that enables generation of a LO signal by a PLL circuit within the single-chip, and enables calibration of a frequency response for a filter circuit integrated within the chip. A reference signal is generated based on the generated LO signal and a synthesizer control signal. The frequency response is calibrated by adjusting the filter based on the generated reference signal.

RC calibration techniques that provide flexibility in calibrating to different RC time constants while offering greater accuracy than existing techniques are desired.

SUMMARY

A method of calibrating a resistor-capacitor (RC) filter to a desired cutoff frequency is disclosed. The RC filter is initialized with a cutoff frequency. An input signal indicative of the desired cutoff frequency is filtered with (by) the RC filter to provide a filter output signal having phase and frequency values. The cutoff frequency of the RC filter is adjusted based on the phase and frequency values of the filter output signal if the phase and frequency values do not satisfy a predetermined condition. The filtering and adjusting are repeated until the phase and frequency values of the filter output signal satisfy the predetermined condition.

A calibration apparatus has a frequency generator, a resistor-capacitor (RC) filter, a phase comparator, a frequency detector, and a state machine. The frequency generator is configured to provide a reference signal. The RC filter is coupled to receive the reference signal and provide a filter output signal. The phase comparator is coupled to receive the reference signal and the filter output signal. The frequency detector is coupled to receive the reference signal and the filter output signal. The phase comparator, frequency detector, and state machine are configured to calibrate a cutoff frequency of the RC filter to a value specified by the reference signal based on the filter output signal of the RC filter.

A digital RC calibration circuit has a phase comparator, a frequency detector, and a state machine. The phase comparator is configured to receive a reference signal and a quadrature output of an RC filter. The frequency detector is configured to receive the reference signal and the quadrature output of the RC filter. The state machine is configured to process outputs of the phase comparator and the frequency detector, respectively, to provide a capacitor code to calibrate the RC filter to a desired cutoff frequency.

The construction and method of operation of disclosed embodiments, however, will be best understood from the following descriptions of specific embodiments when read in connection with the accompanying figures.

BRIEF DESCRIPTION OF THE DRAWINGS

The following will be apparent from elements of the figures, which are provided for illustrative purposes and are not necessarily to scale.

DETAILED DESCRIPTION

All references cited herein are hereby incorporated by reference in their entirety.

Embodiments are described below, which employ a signal indicative of a desired filter characteristic (e.g., cutoff frequency) directly, without need for a preliminary bandwidth code (BWC) computation via simulation. Some embodiments use simple circuitry to detect phase and frequency characteristics of signals rather than relying on falling voltages that must be calibrated to a BWC. Local process variation is advantageously suppressed in some embodiments, resulting in increased RC calibration accuracy relative to the prior art. Furthermore, some embodiments utilize an underlying core RC filter for bandwidth detection, obviating the need for a separate analog detection block.

Figure 1:
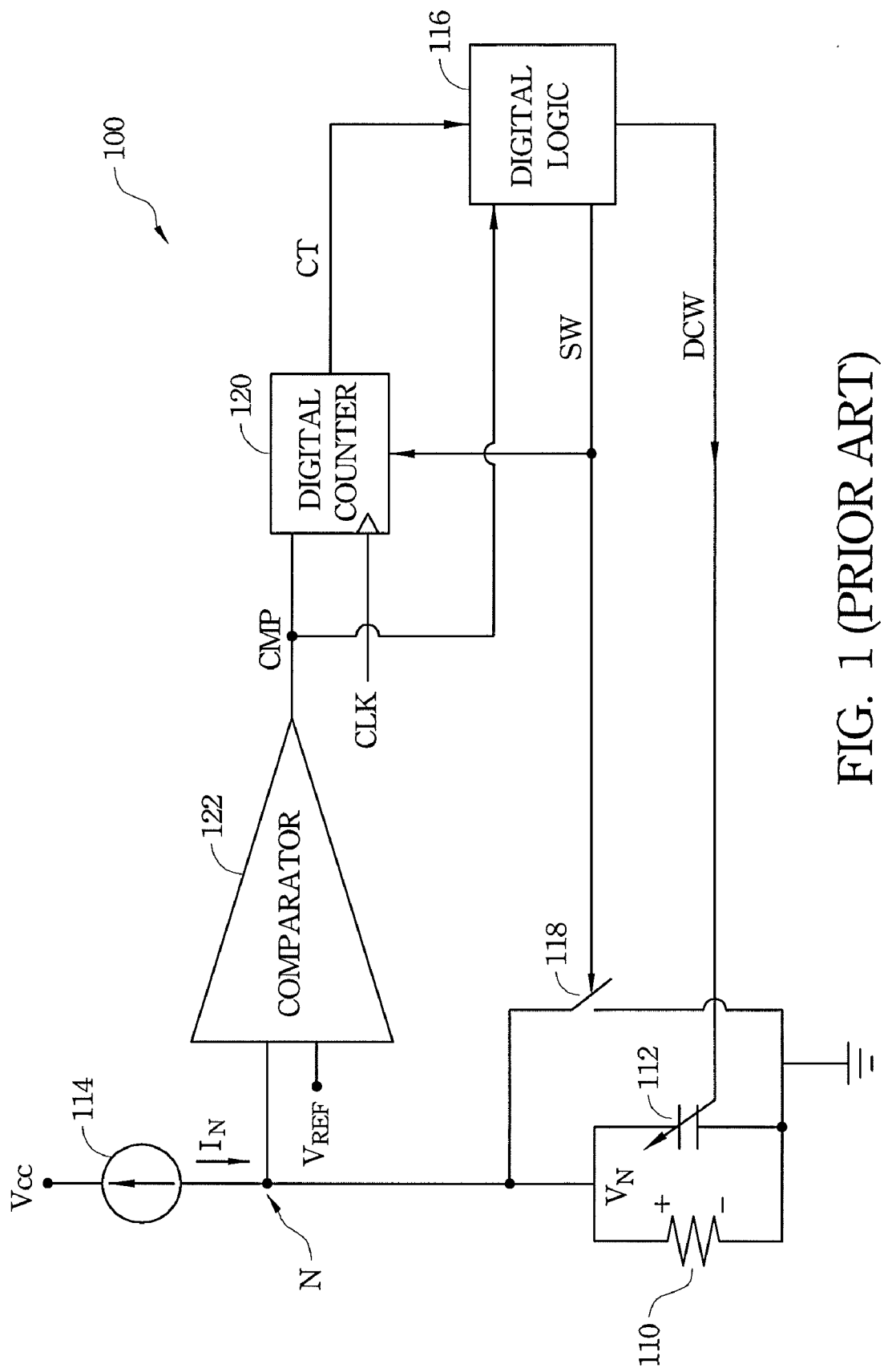
FIG. 1 is a block diagram of a prior art resistor-capacitor (RC) calibration circuit.
Figure 2:
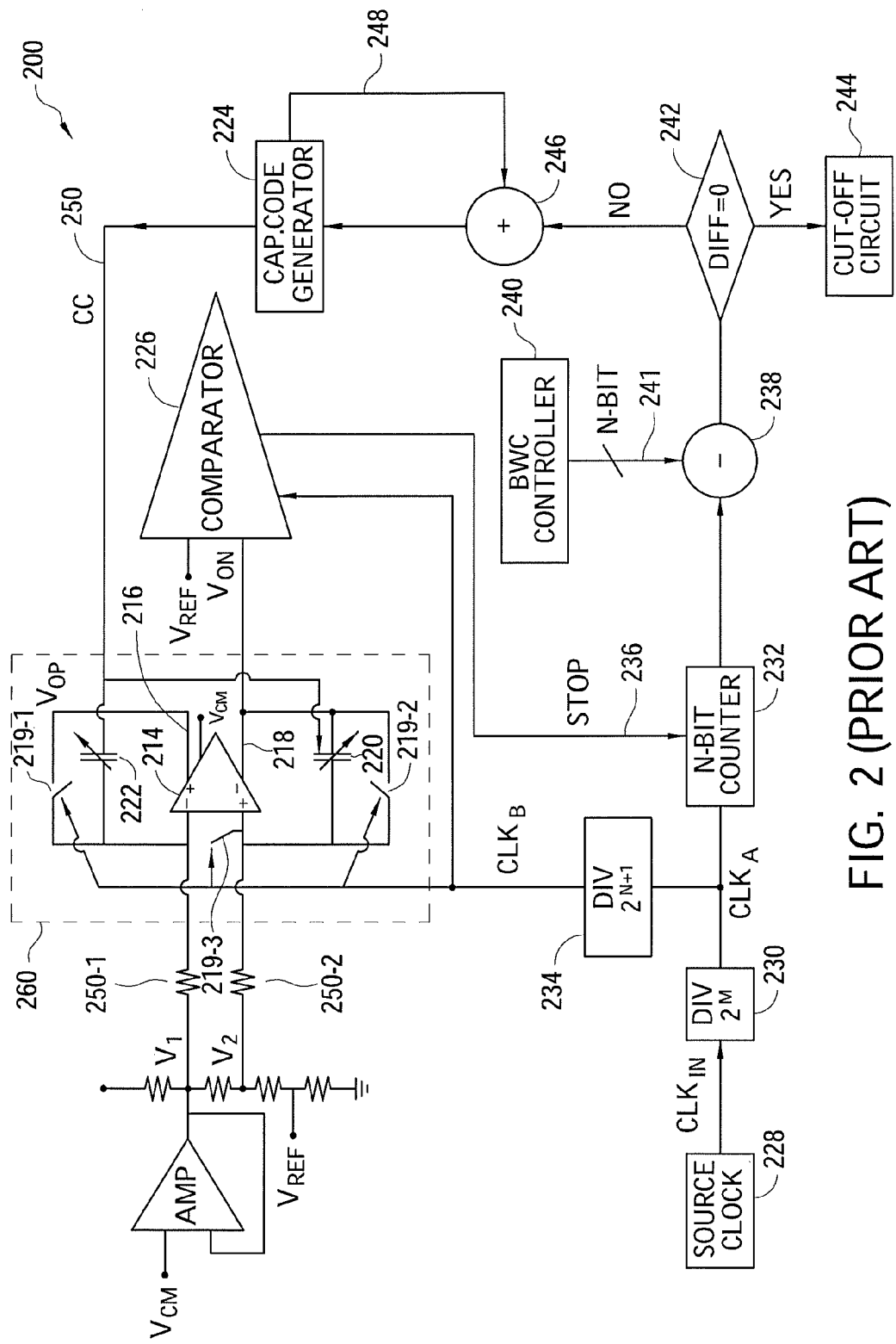
FIG. 2 is a block diagram of another prior art RC calibration circuit.
Figure 3:
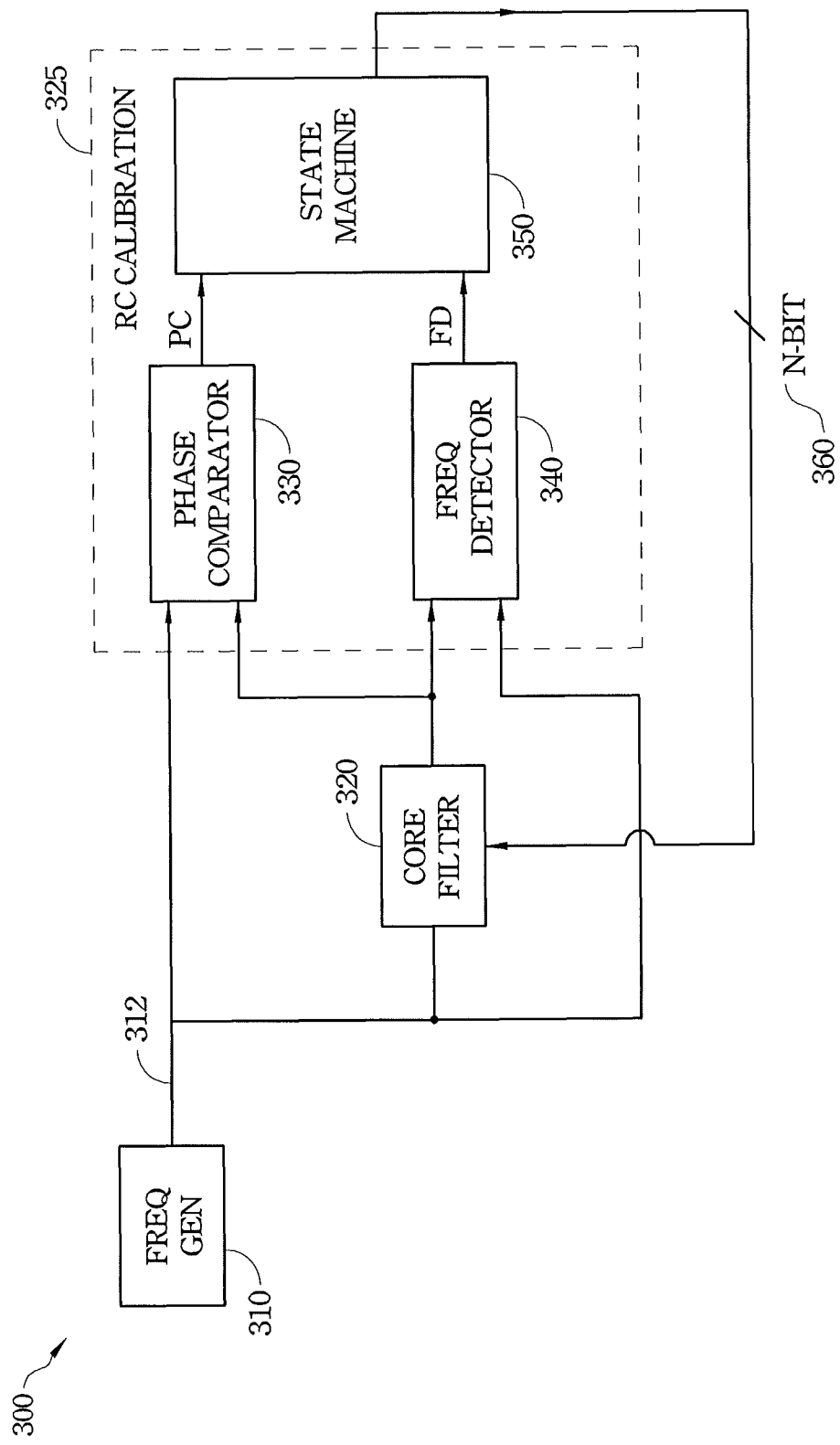
FIG. 3 is a block diagram of an RC calibration circuit in accordance with an embodiment.

FIG. 3 is a block diagram of an RC calibration approach in accordance with an embodiment. A frequency generator 310, which may be the output of a mixer, generates a signal at a frequency corresponding to a desired cutoff frequency of a core RC filter 320 to be calibrated. The desired cutoff frequency indicated by the signal provided by frequency generator may be in the range from 1 to 10 MHz. The output of frequency generator 310 is provided as an input to core filter 320 and also as input to an RC calibration circuit 325. It should be understood by one of ordinary skill in the art that the output of frequency generator 310, i.e., signal 312, may be processed by an intermediate component preceding core filter 320 or RC calibration subsystem 325. In other words, signal 312 can be indicative of the desired cutoff frequency rather than having that cutoff frequency itself. RC calibration subsystem 325 comprises a phase comparator 330, a frequency detector 340, and a state machine 350. A first input of state machine 350 is coupled to an output signal PC of phase comparator 330, and a second input of state machine 350 is coupled to an output signal $F_D$ of frequency detector 340. An N-bit output signal 360 from state machine 350 is fed back to core RC filter 320 to calibrate the filter. For example, state machine 350 may provide an N-bit capacitor code, e.g., an 8-bit capacitor code, to core filter 320 to update the capacitances of variable capacitors therein. The capacitor code may be decremented by a counter of state machine 350, which may correspond to increasing a cutoff frequency of the core RC filter 320 from a minimum value of 1 MHz (or another value in the range between 1-10 MHz) until calibration is achieved or until a maximum value of 10 MHz is reached. For example, an 8-bit capacitor code may be decremented from an initial value of 127 until calibration is achieved, with the initial value of 127 corresponding to a frequency of 1 MHz and with frequency rising linearly, from 1 to 10 MHz, as the code is correspondingly decremented. Seven bits of the capacitor code are used in this example, to provide codes between 0 and 127, with the most significant bit fixed to, e.g., 1. Suitable modification may enable all eight bits of the capacitor code to vary as well. By decrementing a counter in this manner (i.e., increasing cutoff frequency from an initial value that is between 1 and 10 MHz, preferably about 1 MHz), a desired cutoff frequency may be achieved faster than would be achieved by incrementing such a counter (decreasing such a cutoff frequency). When a predetermined condition is met, e.g., when an output signal from core filter 320 is locked to signal 312 in frequency and differs from signal 312 in phase by at least a predetermined offset, e.g., 90°, state machine 350 may freeze (capture) its count value, as that condition indicates that the core filter is calibrated to the desired RC time constant and the filter bandwidth is accordingly calibrated to the desired value.

Figure 4A:
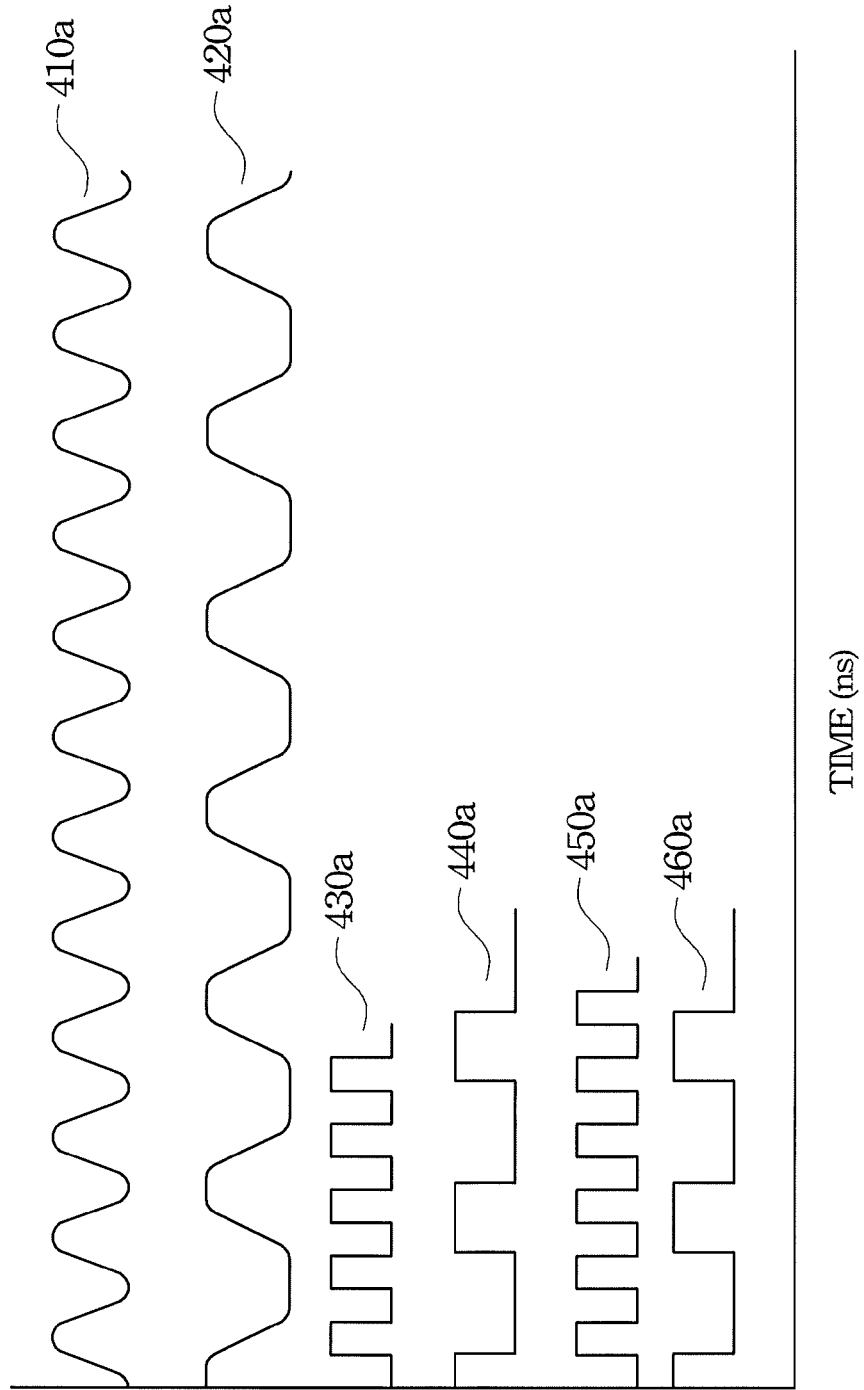
FIGS. 4A-B are signal traces illustrating operation of an RC calibration circuit in accordance with an embodiment: initial startup (FIG. 4A) and final calibration (FIG. 4B).
Figure 4B:
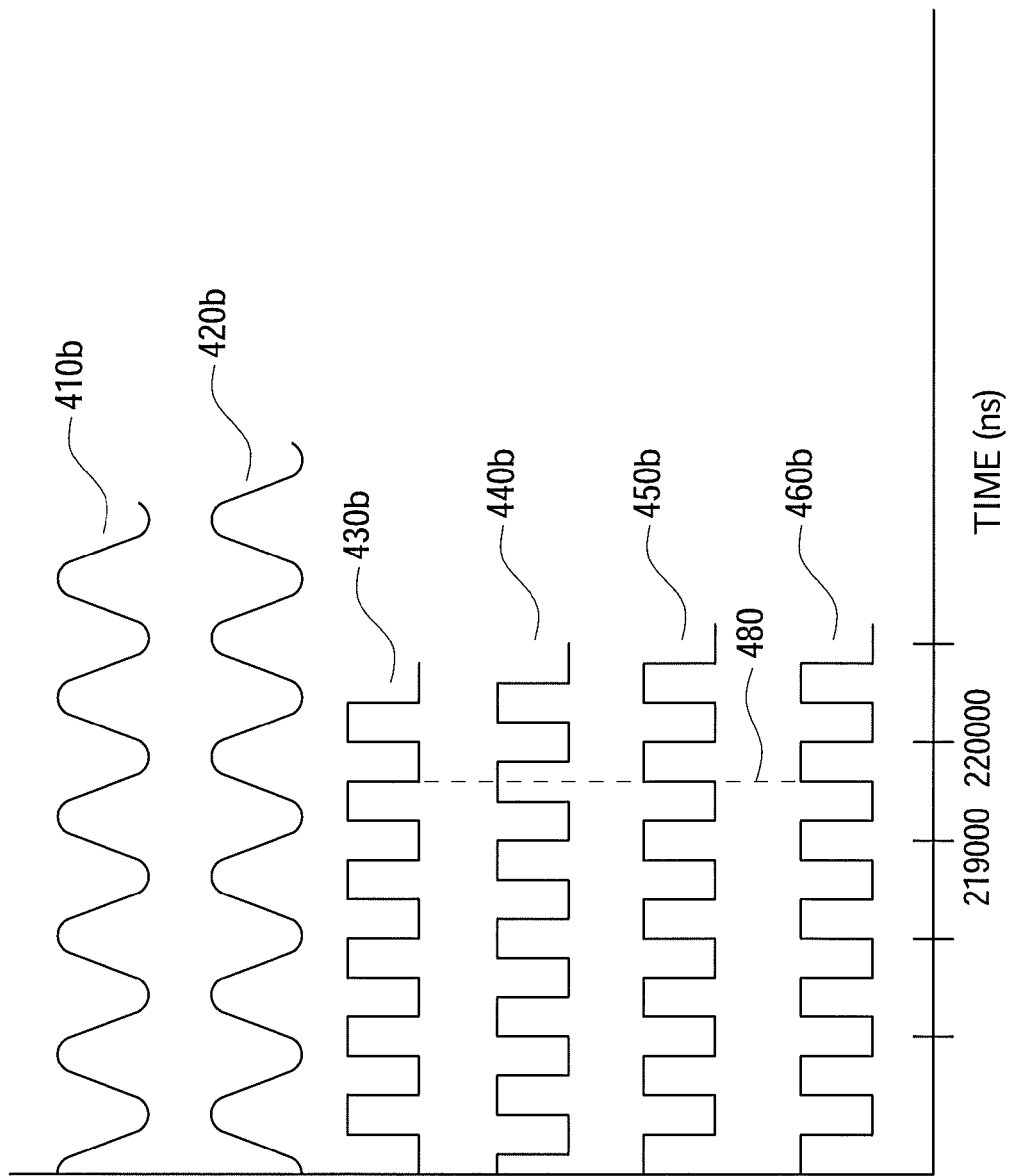

FIGS. 4A-B are signal traces illustrating operation of an RC calibration circuit in accordance with an embodiment. FIG. 4A shows operation of an RC calibration circuit as in FIG. 3 a short time after startup, i.e., before calibration is achieved. The example shown in FIG. 4A corresponds to a core lowpass RC filter fabricated in accordance with a 40 nm CMOS process, with a 1.1 V core voltage for the core filter and slowly evolving PMOS and NMOS processes operating at 120° C. Waveform 410a corresponds to signal 312 of FIG. 3 and specifies the desired bandwidth of the lowpass filter, i.e., 4 MHz in this example. Waveform 420a is the output of the core RC filter for this example (e.g., corresponding to filter 320 of FIG. 3), i.e., the result of filtering waveform 410a. The example of FIG. 4A corresponds to capacitor codes in the range between 123 and 120, after having been decremented from an initial value of 127. It should be understood that capacitor codes may be implemented to increment with analogous functionality. As shown, the output of the core filter (i.e., waveform 420a) does not have a similar frequency to waveform 410a, because the cutoff frequency of the core filter has not yet been stepped to a high enough value corresponding to the frequency of waveform 410a, i.e., the counter producing the capacitor codes has not been decremented to a terminating condition yet. During the time interval shown in FIG. 4A, frequency lock between the input to the core filter and the output from the core filter has not yet been achieved, as seen by waveforms 450a and 460a (showing digital representations of frequency information for the input to the core filter and the output from the core filter, respectively). Similarly, the output from the core filter has not yet reached a predetermined phase lag (e.g., 90°) with respect to the input to the core filter, as shown by waveforms 430a and 440a (showing digital representations of phase information for the input to the core filter and the output from the core filter, respectively). From the initial state shown in FIG. 4A, additional decrementing (corresponding to stepping the cutoff frequency of the core filter higher) is needed to progress towards calibration.

FIG. 4B shows signal traces similar to FIG. 4A but at a time interval corresponding to final calibration, i.e., when calibration is achieved and detected. During this interval, corresponding to a capacitor code of 40 (i.e., a counter that has decremented from 127 to 40), frequency lock is observed between the input and output of the core filter, as shown by waveforms 450b (input) and 460b (output) and by dashed line 480 indicating simultaneous clock rising edges of the two signals. Similarly, the output of the core filter lags the input by 90°, as shown by waveforms 430b (input) and 440b (output) and by dashed line 480. At this point in time, the cutoff frequency of the core filter has been increased sufficiently so that the frequency corresponding to waveform 410b (the input to the core filter, indicating the desired RC characteristic) is passed by the core filter, as shown by waveform 420b (output of the core filter) having the same frequency as waveform 410b. At this point in time, the state machine may provide an indication that calibration has been achieved and that no further decrementing is to be performed.

Figure 5:
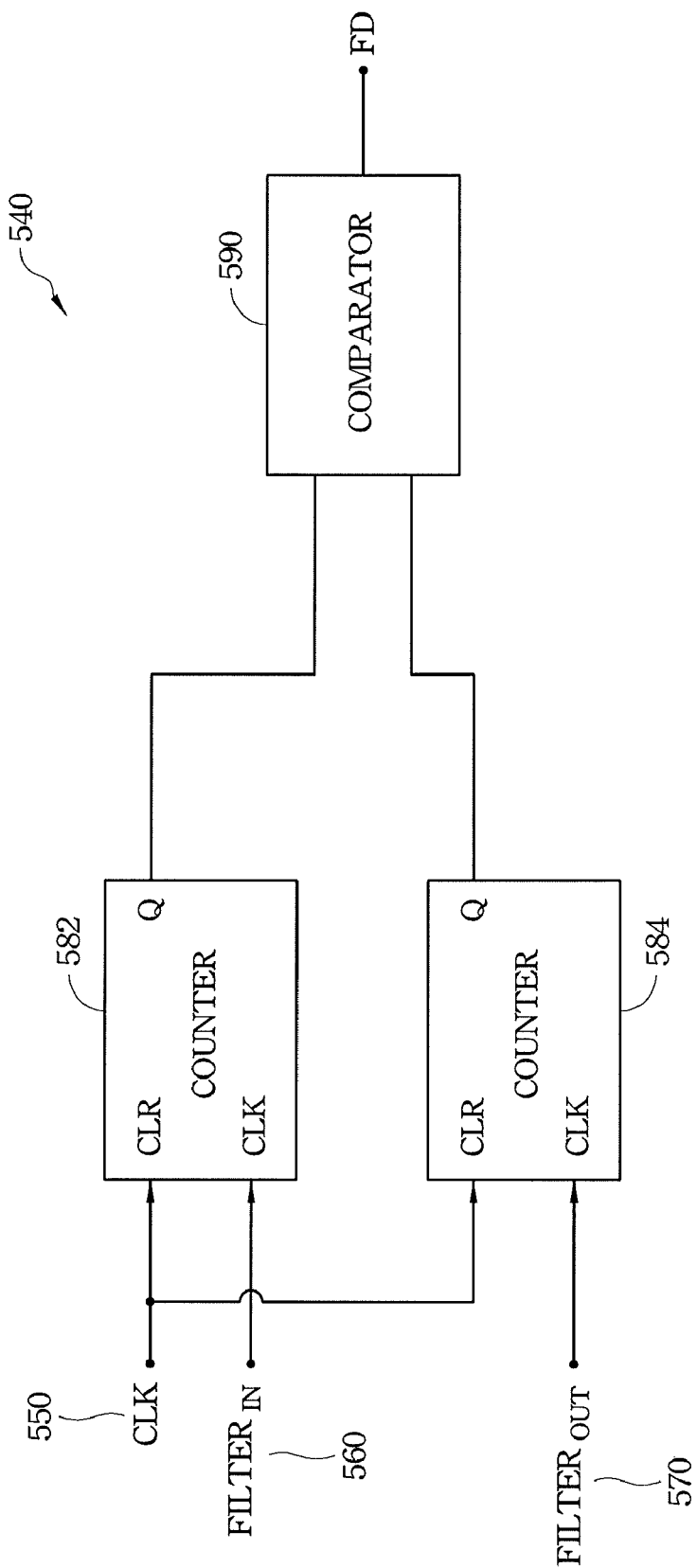
FIG. 5 is a block diagram of a frequency detector in accordance with an embodiment.

FIG. 5 is a block diagram for a frequency detector 540, e.g., corresponding to frequency detector 340 of FIG. 3. Frequency detector 540 is used to detect frequency lock between two signals as described above. A first counter 582 and a second counter 584 are both provided a clock signal CLK 550 at corresponding clear (CLR) inputs. Counters 582, 584 may be decrementing counters in some embodiments but may also be implemented as incrementing counters in other embodiments. Clock inputs to counters 582, 584 are coupled to filter input signal $FILTER_{IN}$ 560, which corresponds to signal 312 of FIG. 3, and to filter output signal $FILTER_{OUT}$, which corresponds to the output of core filter 320 in FIG. 3. Q outputs of counters 582, 584 are coupled to inputs of a comparator 590, which provides a signal FD, corresponding to equality of the inputs, which may be asserted low to indicate frequency lock. One of ordinary skill in the art should understand that the logic may be inverted in another implementation.

Figure 6:
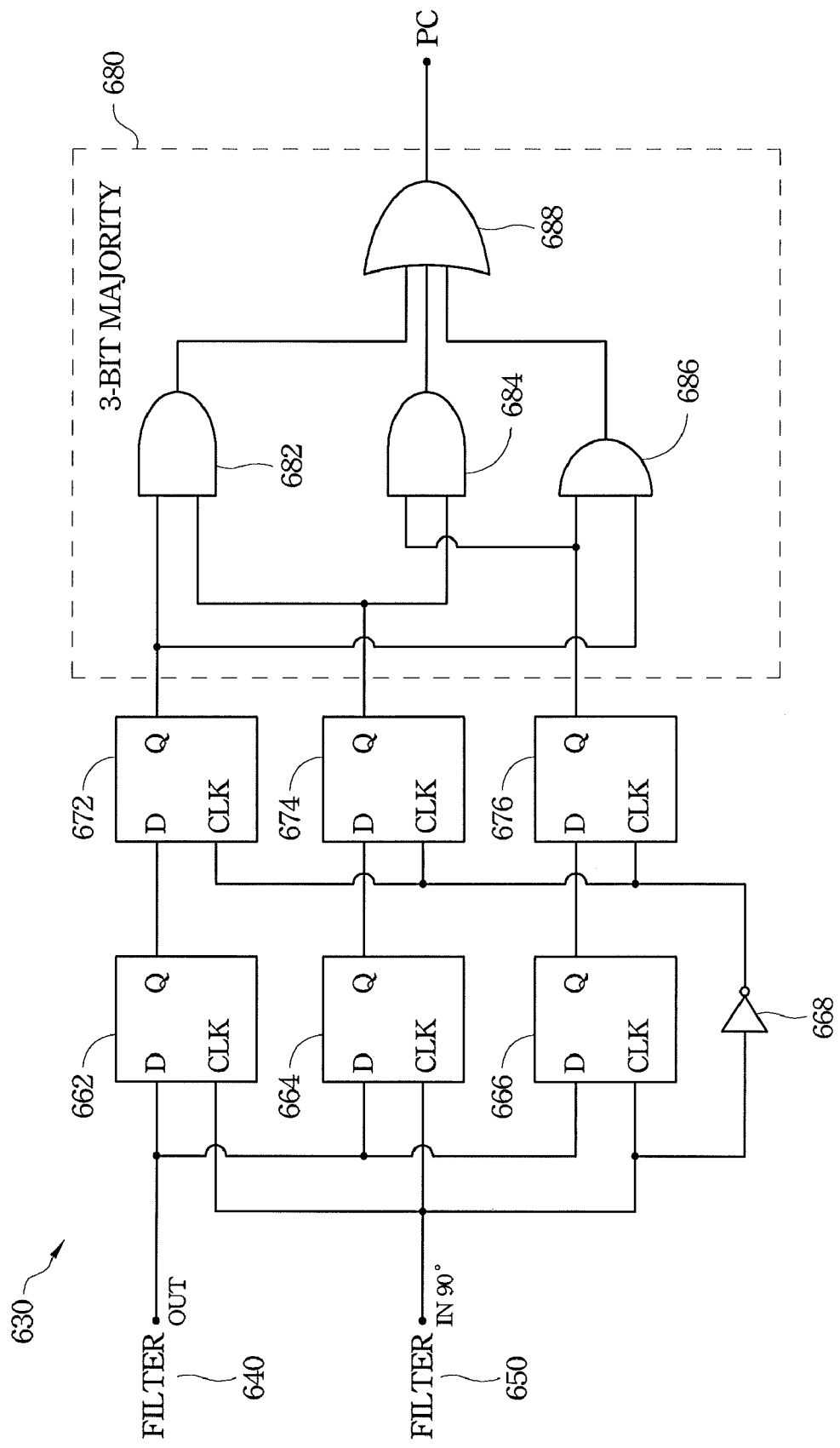
FIG. 6 is a block diagram of a phase comparator in accordance with an embodiment.

FIG. 6 is a block diagram of a phase comparator 630, e.g., corresponding to phase comparator 330 of FIG. 3. Phase comparator 630 has two inputs, which are an output signal 640 from a core filter (denoted $FILTER_{OUT}$), corresponding to the output of core filter 320 in FIG. 3, which may be a quadrature output, and a phase-shifted input 650 to the core filter (denoted $FILTER_{IN\ 90}$, e.g., a quadrature reference signal), corresponding to signal 312 of FIG. 3. In the example shown in FIG. 6, signal 650 is a 90°-delay of signal 640, so phase comparator 630 provides a phase comparison output signal PC indicative of a phase lag of at least 90° between the two inputs to phase comparator 630, where PC=0 when such a lag is present; however, thresholds other than 90° may be used as well. Basing a determination of calibration on a detection of a phase lag of at least 90° has been shown to yield high accuracy in RC calibration.

Phase comparator 630 is implemented as shown in FIG. 6 with two stages of D flip-flops and a 3-bit majority circuit 680. In a first stage, D flip-flops 662, 664, 666 are all coupled at their D inputs to signal 640 and at their CLK inputs to $FILTER_{IN\ 90}$. In a second stage, D flip-flops 672, 674, 676 are all coupled at their D inputs to Q outputs from respective flip-flops from the first stage and are coupled at their CLK inputs to an inverted version of $FILTER_{IN\ 90}$. 3-bit majority circuit 680 provides output PC indicative which bit (0 or 1) constitutes a majority bit among the Q outputs of flip-flops 672, 674, 676. 3-bit majority circuit 680 is implemented conventionally using AND gates 682, 684, 686 and OR gate 688, as shown in FIG. 6.

Figure 7:
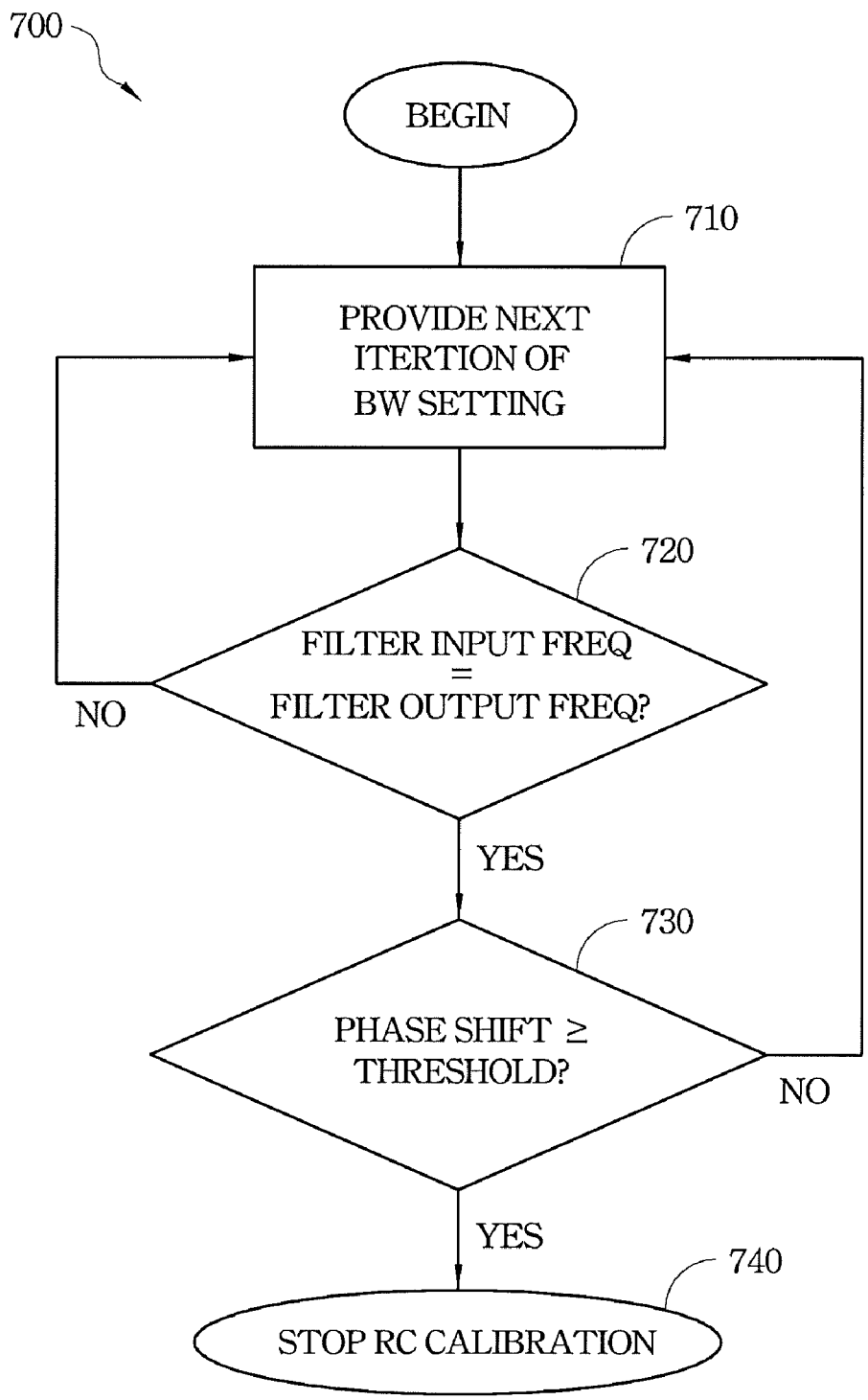
FIG. 7 is a flow diagram in accordance with an embodiment.

FIG. 7 is a flow diagram in accordance with an embodiment. FIG. 7 depicts functionality at a state machine, e.g., state machine 350 of FIG. 3. After process 700 begins, the state machine provides a next iteration of a bandwidth setting (710), e.g., by providing a digital capacitor code. Providing the next iteration may correspond to providing a decremented counter value or an incremented counter value. A counter may be implemented as is known in the art and may be provided a separate clock signal, e.g., a 500 KHz clock. An RC filter input frequency is compared (720) to an RC filter output frequency. If the two values are not equal, process 700 proceeds to the next iteration at 710. If the two values are equal to one another, a relative phase shift (lag) between a filter input signal and a filter output signal is determined and compared to a threshold (730). The threshold may be a 90° phase lag. If the relative phase shift is less than the threshold, process 700 proceeds to the next iteration at 710. If the relative phase shift is at least equal to the threshold, then RC calibration may be stopped (740), because the state machine has determined at this point that both frequency lock and a minimum phase lag have been achieved. It should be understood that because both conditions are required in a conjunctive ("AND") sense, either condition may be tested before the other; in other words, the flow may be different than as depicted in FIG. 7, e.g., with the relative positions of the frequency detection check (720) and the phase comparison (730) interchanged.

Figure 8:
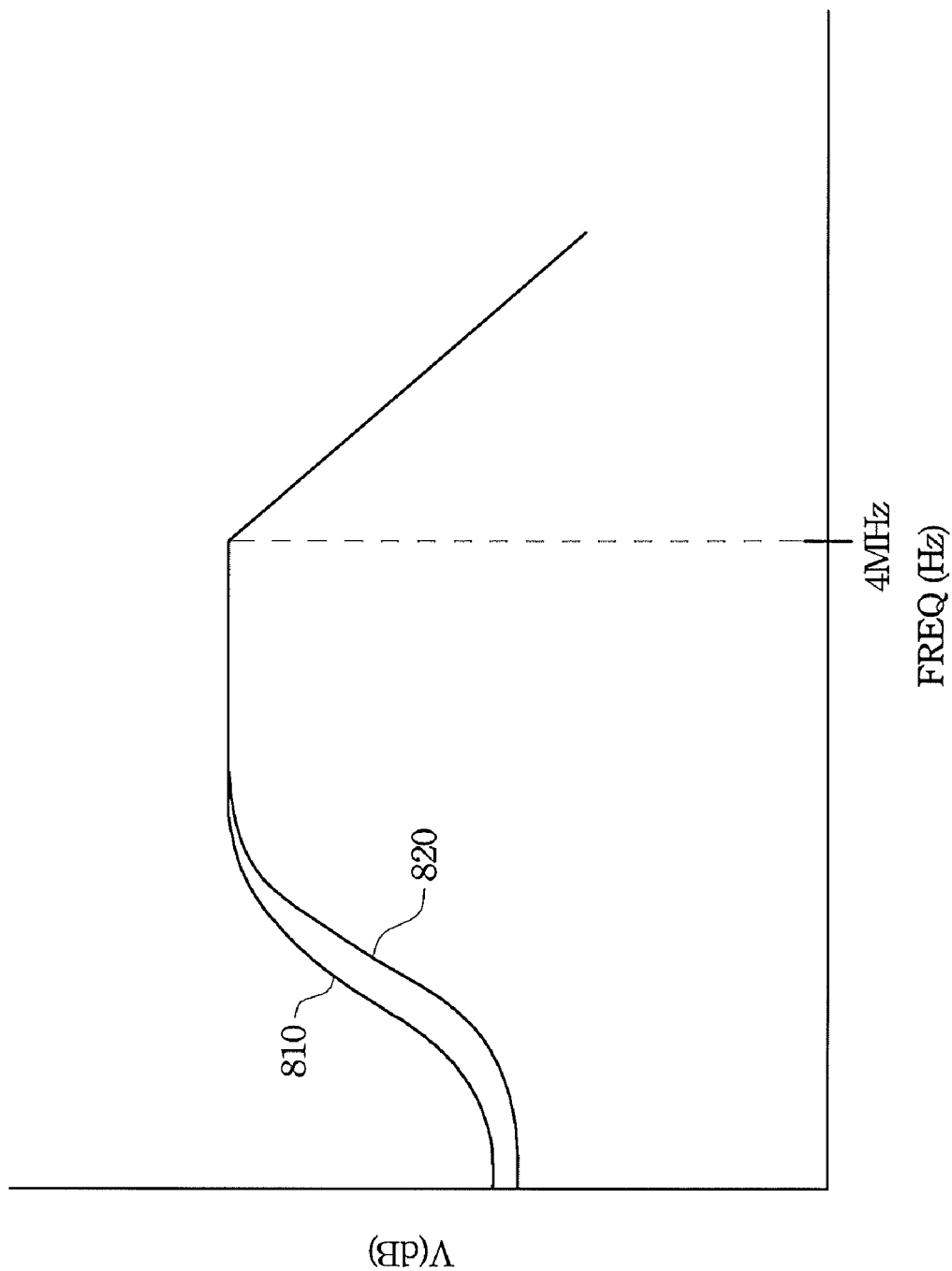
FIG. 8 is a plot showing accurate RC calibration in accordance with an embodiment.

FIG. 8 is a plot showing accurate RC calibration in accordance with an embodiment. The AC response of an analog RC filter is shown at two different process, voltage, and temperature (PVT) operating conditions: slowly evolving PMOS/NMOS at 120° C. and a core voltage of 1.21V for trace 810 and a typical process at 27° C. and a core voltage of 1.1V for trace 820. Both traces correspond to a 40 nm lowpass RC core filter. As shown in FIG. 8, both operating conditions exhibit accurate cutoff at a desired frequency of 4 MHz, indicating successful calibration.

Thus, some embodiments employ phase comparison and frequency detection to sense a desired bandwidth, without the need for an external analog block. Calibration is truly automatic and may be accomplished using the desired frequency as the single input parameter. That frequency is directly provided via a generated signal, without the need for a preliminary simulation of a bandwidth code that is itself susceptible to inaccuracy due to process, voltage, and/or temperature (PVT) variations. Filter characteristics such as cutoff frequencies are then determined automatically. Furthermore, an all-digital solution for RC calibration can provide increased accuracy and reliability. Calibration is achieved faster than by conventional methods, e.g., within 250 μs as opposed to 1 ms. Various embodiments are easily implemented using simple circuitry and are suited for any filter structure and any order of filter for any application. For example, candidate applications include digital video broadcasting for handheld devices (DVB-H), global positioning satellite (GPS), and other applications involving an RF tuner.

Embodiments may be implemented in the context of an RF tuner as follows. Typically, an RF input is first passed through a low noise amplifier (LNA) and mixer and split into in-phase (I) and quadrature (Q) channels. An analog baseband process module may perform RF filtering, e.g., by providing separate I-channel and Q-channel outputs. RC filter calibration operates in some embodiments using the I-channel but other embodiments may use the Q-channel as well. The I and Q channels may be calibrated simultaneously or nearly simultaneously, e.g., as described in U.S. Pat. Pub. No. 2007/0207760, by Kavadias.

Although examples are illustrated and described herein, embodiments are nevertheless not limited to the details shown, since various modifications and structural changes may be made therein by those of ordinary skill within the scope and range of equivalents of the claims. For example, although capacitor codes are disclosed as being stepped in one direction, they may also be varied randomly or deterministically within a range of possible cutoff frequencies in some other manner. Similarly, although core RC filters have been described above as lowpass filters for illustrative purposes, it should be understood by one of ordinary skill in the art that highpass or bandpass filters may be similarly implemented in accordance with embodiments. For example, for highpass operation, frequencies may be swept from higher frequencies to lower frequencies, with a phase difference threshold of 90° used by the phase comparator as in lowpass operation. For bandpass operation, a phase difference threshold of 0° may be used.

What is claimed is:

1. A method of calibrating a resistor-capacitor (RC) filter to a desired cutoff frequency, the method comprising:
   initializing the RC filter with a cutoff frequency;
   filtering an input signal, indicative of the desired cutoff frequency, with the RC filter to provide a filter output signal having phase and frequency values;
   adjusting the cutoff frequency of the RC filter, based on the phase and frequency values of the filter output signal, if the phase and frequency values do not satisfy a predetermined condition, wherein the predetermined condition is that the input signal is locked in frequency to the filter output signal and the filter output signal lags the input signal in phase by at least a specified threshold; and repeating the filtering and adjusting until the phase and frequency values of the filter output signal satisfy the predetermined condition.

2. The method of claim 1 wherein adjusting the cutoff frequency of the RC filter includes stepping the cutoff frequency in a single direction.

3. The method of claim 2 wherein stepping the cutoff frequency includes increasing the cutoff frequency.

4. The method of claim 3 wherein the cutoff frequency is increased in a range between 1 and 10 MHz until the predetermined condition is satisfied.

5. The method of claim 1 wherein the RC filter is a lowpass filter circuit.

6. The method of claim 5 wherein the specified threshold is 90 degrees.

7. A calibration apparatus comprising:
a frequency generator configured to provide a reference signal;
a resistor-capacitor (RC) filter configured to filter the reference signal and provide a filter output signal;
a phase comparator coupled to receive the reference signal and the filter output signal;
a frequency detector coupled to receive the reference signal and the filter output signal; and
a state machine;
wherein the phase comparator, the frequency detector, and the state machine are configured to calibrate a cutoff frequency of the RC filter to a value specified by the reference signal based on the filter output signal of the RC filter, and the RC filter is configured to be calibrated by varying a capacitance of a variable capacitor of the RC filter until the reference signal is locked in frequency to the output of the RC filter and the output of the RC filter lags the reference signal in phase by at least a specified threshold.

8. The calibration apparatus of claim 7 wherein the state machine comprises a counter configured to be decremented to step the cutoff frequency of the RC filter higher from an initial value between 1 and 10 MHz.

9. The calibration apparatus of claim 7, wherein the apparatus is included in a radio frequency (RF) tuner for RC calibration in the RF tuner.

10. The calibration apparatus of claim 7 wherein the RC filter is a lowpass filter circuit.

11. The calibration apparatus of claim 10 wherein the lowpass filter circuit is an 8th order Chebyshev filter circuit.

12. The calibration apparatus of claim 7 wherein the output of the RC filter is a quadrature component.

13. The calibration apparatus of claim 7 wherein the RC filter has a critical dimension associated with a 40 nm CMOS process.

14. The calibration apparatus of claim 7 wherein the specified threshold is 90 degrees.

15. A digital RC calibration circuit comprising:
a phase comparator configured to receive a reference signal and a quadrature output of an RC filter;
a frequency detector configured to receive the reference signal and the quadrature output of the RC filter; and
a state machine configured to process outputs of the phase comparator and the frequency detector, respectively, to provide a capacitor code to a variable capacitor of the RC filter to calibrate the RC filter to a desired cutoff frequency;
wherein the frequency detector comprises:
a first N-bit counter having a CLEAR input coupled to a clock, and having a CLK input coupled to the input to the RC filter;
a second N-bit counter having a CLEAR input coupled to the clock, and having a CLK input coupled to the in-phase output of the RC filter; and
an N-bit comparator providing an output indicative of whether outputs of the first and second N-bit counters are equal.

16. The digital RC calibration circuit of claim 15 wherein the phase comparator comprises:
a first stage of three D flip-flops, a D input of each flip-flop in the first stage coupled to the in-phase output of the RC filter, and a CLK input of each flip-flop in the first stage coupled to an input to the RC filter shifted in phase by a predetermined offset;
a second stage of three D flip-flops, a D input of each flop in the second stage coupled to a Q output of a corresponding flip-flop in the first stage, and a CLK input of each flip-flop in the second stage coupled to the input to the RC filter, shifted in phase by 90 degrees and inverted; and
a three-bit majority circuit receiving as inputs a Q output from each of the three flip-flops in the second stage and providing as an output of the phase comparator a majority bit among the three second-stage Q outputs.

17. The digital RC calibration circuit of claim 16 wherein the predetermined offset is a phase shift of 90 degrees.

* * * * *